United States Patent [19]

Lin et al.

[11] 4,374,179

[45] Feb. 15, 1983

[54] PLASMA POLYMERIZED ETHANE FOR INTERLAYER DIELECTRIC

[75] Inventors: Jacob W. Lin, Bloomington; Leslie S. Weinman, Eden Prairie, both of Minn.

[73] Assignee: Honeywell Inc., Minneapolis, Minn.

[21] Appl. No.: 217,645

[22] Filed: Dec. 18, 1980

[51] Int. Cl.$^3$ .................. B32B 9/04; B32B 27/32; B05D 3/06

[52] U.S. Cl. .................. 428/411; 204/170; 427/34; 427/38; 427/41; 427/255.6; 428/451; 428/523

[58] Field of Search ............... 428/195, 201, 209, 210, 428/451, 523, 411; 427/34, 38, 41, 99, 255.6; 204/170

[56] References Cited

U.S. PATENT DOCUMENTS

| | | | |
|---|---|---|---|
| 3,518,108 | 6/1970 | Heiss, Jr. et al. | 204/170 |
| 4,000,054 | 12/1976 | Marcantonio | 427/99 |
| 4,020,221 | 4/1977 | Kusakawa et al. | 428/201 |
| 4,132,829 | 1/1979 | Hudis | 428/411 |
| 4,136,225 | 1/1979 | Feit et al. | 428/201 |
| 4,227,039 | 10/1980 | Shibasaki et al. | 428/201 |
| 4,269,896 | 5/1981 | Yamagishi | 428/409 |

OTHER PUBLICATIONS

Hiratsuka et al., "Plasma Polymerization of Some Simple Saturated Hydrocarbons", Journal of Applied Science, 22(4), Apr. 1978, pp. 917-925.

Morita et al., "Effect of Discharge Frequency on the Plasma Polymerization of Ethane", Organic Coatings and Plastic Chemistry, 40, pp. 451-455, Apr. 1979.

Tibbett et al., "IR Laser Window Coating by Plasma Polymerized Hydrocarbons", Fifth Conference on Infrared Laser Materials, Feb. 1976, pp. 205-212.

*Primary Examiner*—William R. Dixon, Jr.
*Attorney, Agent, or Firm*—Omund R. Dahle

[57] ABSTRACT

A plasma polymerized ethane thin film deposited on a variety of substrates has been discovered to be an improved interlayer dielectric. It is a material having property of high dielectric strength and unique low dielectric constant. It also has advantages of depositing pinhole free, crack resistant with good step coverage and low deposition cost.

9 Claims, No Drawings

PLASMA POLYMERIZED ETHANE FOR INTERLAYER DIELECTRIC

BACKGROUND AND SUMMARY OF THE INVENTION

This invention relates to thin film dielectric materials for use in the manufacture of thin film electronics.

In the prior art many materials have been used as dielectrics in electronic devices and circuits. In the developing microcircuit electronics and packaging and particularly in the VHSIC (very high speed integrated circuits) program there is a need for an interlayer dielectric film which has a high dielectric strength and a low dielectric constant, that is compatible with thin-film procedures and that can be photopatterned. The material must deposit pinhole free, crack resistant, provide good step coverage and have a low deposition cost. It must be possible to apply the material at low temperatures. In this invention there is described an improved dielectric material for use as an interlayer dielectric in thin film electronic packaging. The material is plasma polymerized ethane.

DESCRIPTION

This invention describes a dielectric material, plasma polymerized ethane, (PPE) for use in a multi-layer thin film electronic package. The multi-layer package generally includes a substrate such as silicon or ceramic, first conductive paths deposited on the substrate surface, a thin film layer of PPE dielectric over the first conductive paths and substrate surface, second conductive paths over the PPE layer and further layers as desired. High-density, high reliability packaging requires thin-film dielectrics having high dielectric strength and low dielectric constant, that deposit pinhole free, crack resistant and provide good step coverage at a low deposition cost, and that are processable at low temperatures. The material PPE is chemically inert, has excellent mechanical properties and has a unique low dielectric constant. PPE is deposited on a substrate by passing ethane vapor through a plasma generated by an RF glow discharge. The properties of the PPE can be controlled by changing the deposition conditions. The table below summarizes the results of producing PPE thin film test capacitors on ceramic and silicon. It will be noted for example that the dielectric constant for PPE on ceramic is about 1.6 at 10 KHz and on silicon is 1.85, both readings fitting the category of a low dielectric constant. The low dielectric constant and good breakdown voltage properties allow very thin layers of PPE to be utilized. The low dielectric constant means low capacitance effect between the metal layers and thus improves the speed of the device. The fact that PPE maintains a high dielectric strength after exposure to high humidity for a week assures long term reliability.

TABLE

Dielectric Properties of Plasma Polymerized Ethane (PPE)

| Parameters | PPE on $Al_2O_3$ | on Si |
|---|---|---|
| Thickness ($\mu$m) | 2.4 | 2.8 |
| Dissipation factor | .078 | .15 |
| Leakage current (amp) | $3 \times 10^{-11}$ | $3 \times 10^{-11}$ |
| Leakage current after 1 week at room temperature and 90% RH (amp) | $3 \times 10^{-11}$ at 800V | |
| Dielectric constant | 1.58 | 1.85 |
| Breakdown voltage (V/cm) | $>10^6$ | $>10^6$ |
| Current prior to breakdown (amp) | $3 \times 10^{-11}$ | $3 \times 10^{-11}$ |
| Voltage where leakage rises above background (V) | 900 | 1000 |

The embodiments of the invention in which an exclusive property or right is claimed are defined as follows:

1. A multilyer solid state device which comprises:
   a substrate;
   a conductive area deposited on said substrate; and,
   a dielectric layer of plasma polymerized ethane (PPE) deposited over said conductive area.

2. A device according to claim 1 wherein the substrate is ceramic.

3. The device according to claim 2 wherein the ceramic is $Al_2O_3$.

4. The device according to claim 1 wherein the substrate is silicon.

5. The device according to claim 1 and further comprising at least one further conductive area deposited on the surface of said plasma polymerized ethane layer.

6. A multilayer solid state device which comprises:
   a substrate;
   a conductive area deposition on said substrate surface; and,
   a dielectric layer of plasma polymerized ethane deposited on the substrate and conductive area by plasma polymerizing of a monomer ethane.

7. The device according to claim 1 wherein the dielectric constant of said PPE is less than 2.

8. The device according to claim 7 wherein the dielectric constant of said PPE is about 1.6.

9. In a multilayer solid state device, an improved dielectric interlayer layer, which has a low dielectric constant and a high dielectric strength comprising a layer of plasma polymerized ethane.

* * * * *